(12) United States Patent
Flachs

(10) Patent No.: US 7,219,507 B1
(45) Date of Patent: May 22, 2007

(54) CONFIGURABLE, NONLINEAR FAN CONTROL FOR SYSTEM-OPTIMIZED AUTONOMOUS COOLING

(75) Inventor: Victor Flachs, Rishon-Le-Zion (IL)

(73) Assignee: Winbond Electronics Corporation, Hsinchu (TW)

( * ) Notice: Subject to any disclaimer, the term of this patent is extended or adjusted under 35 U.S.C. 154(b) by 324 days.

(21) Appl. No.: 10/830,491

(22) Filed: Apr. 21, 2004

(51) Int. Cl.
*F25D 17/04* (2006.01)
*G05D 23/00* (2006.01)
*G05B 13/00* (2006.01)

(52) U.S. Cl. .................. 62/186; 700/290; 700/278
(58) Field of Classification Search .............. 62/186; 361/695, 688, 687; 700/299, 300, 277, 278; 236/DIG. 9; 318/471, 268
See application file for complete search history.

(56) References Cited

U.S. PATENT DOCUMENTS

| | | | | |
|---|---|---|---|---|
| 4,253,153 A | * | 2/1981 | Bitterli et al. .............. | 700/277 |
| 4,386,649 A | * | 6/1983 | Hines et al. ................ | 165/239 |
| 6,051,952 A | * | 4/2000 | Moreira et al. ............. | 318/738 |
| 6,757,592 B1 | * | 6/2004 | Henderson et al. ......... | 700/299 |
| 7,029,239 B2 | * | 4/2006 | Marando et al. ............. | 417/32 |
| 2002/0196606 A1 | * | 12/2002 | Hirao et al. ................ | 361/695 |

OTHER PUBLICATIONS

CALCULUS, Bers and Karal, 1976, Holt, Rinehart and Winston, p. 24-27.*

* cited by examiner

*Primary Examiner*—Chen Wen Jiang

(57) ABSTRACT

Disclosed herein are methods and systems for controlling fan speed by approximating a nonlinear temperature control function activated within a given temperature control range. The temperature control range is divided into numerous linear segments each of which is associated with a sub-range of temperatures and may approximate a segment of the control function. Control coefficients may be determined for each of the linear segments. The controlled temperature is measured and used for determining a corresponding sub-range, and a linear segment. A control signal may be calculated according to the control coefficients of the segment determined by the measured temperature. The control signal is used for the activation of one or more fans, and is continuously determined for new measured temperatures.

21 Claims, 3 Drawing Sheets

CONFIGURABLE, NONLINEAR FAN CONTROL FOR SYSTEM-OPTIMIZED AUTONOMOUS COOLING

TECHNICAL FIELD OF THE INVENTION

The present invention relates generally to the fields of system cooling and nonlinear control, and, more particularly, the present invention relates to a configurable, nonlinear fan control for system-optimized autonomous cooling and method of operating the same.

BACKGROUND OF THE INVENTION

Cooling issues associated with the design of modern computer and communications equipment include the dissipation of high-power levels from temperature sensitive electronic devices. This requires system designers to pay special attention to protecting against temperature hazards while obtaining optimal noise performance.

Conventional cooling tasks in computerized systems commonly include monitoring and controlling the temperature of various temperature-sensitive devices and zones. Speed controlled fans are used for the actual cooling task. Commonly, each monitored zone or device may have a different operating temperature range/limit, which requires that each zone or device be controlled separately to provide the required operating temperature ranges.

Fan speed is controlled commonly through modification of the duty cycle ("DC") of a pulse-width modulated ("PWM") signal (hereinafter, broadly defined as a "control signal"). For purposes of illustration, it is assumed that the control signal is "off" when an associated fan is stopped (i.e., providing no cooling function and generating no noise), and is "on" when the fan is rotating to provide cooling power and generating noise (when the fan is at maximum power, the fan is rotating at "full" speed to provide maximum cooling power and generating maximum noise).

Turning initially to FIG. 1, illustrated is a temperature control graph of an exemplary PRIOR ART fan-cooling temperature control scheme. This scheme is commonly known as a linear control scheme. Conventional exemplary linear control schemes (e.g., NSC LM85, SMsC EMC6D100/EMC6D101, ADI ADM1027) may suitably consist of:

- a Minimal Temperature limit ("Tmin") that defines a low temperature limit for activating cooling means in minimal cooling power ("$DC_{min}$"),
- a Maximal Temperature limit ("Tmax") that defines a high temperature limit for activating cooling means in maximum cooling power ("$DC_{max}$"), and
- a Proportional Range in which the DC of the control signal is linearly changed in proportions with the changes of the measured temperature.

Under this scenario, when the fan is activated, the fan control performs a "spin-up cycle" in which the control signal may be provided with maximum DC to overcome fan inertia. Additionally, a hysteresis range ("H1") may be defined to prevent sequential spin-ups that can occur due to temperature fluctuations near Tmin.

A common problem with linear control schemes occurs from various disadvantages due primarily to the nonlinear nature of the cooling function and control components. For instance, fan speed and DC of the control signal may be represented in quadratic relation, $V \cong K \times \sqrt{PWMDC}$. Such schemes cause abrupt PWM DC changes of the control signal that result in noisy fan speed oscillations.

The efficient cooling function shown in FIG. 1 generates minimal acoustic noise, however, it is nonlinear, and therefore the linear control schemes of the PRIOR ART are not efficient, commonly suffering from significant acoustic noise. Further, additional conditions in controlled cooling schemes may arise due to uncertain factors related to the physical conditions, such as airflow, packaging, available space or the like, in each zone and in the system packaging. It often difficult to approximate an efficient cooling function as a result thereof, particularly since these conditions may vary from one system to the next.

In one example, a modified linear control scheme is implemented that improves temperature control efficiency by dynamically adapting the value of Tmin. By dynamically adapting Tmin as a function of the measured temperature, the slope of the proportional range may continuously be adapted to obtain more efficient cooling, however, this solution commonly requires complex algorithms including different updating cycles to update the Tmin limit value. It is therefore difficult to stabilize the temperature control loop in a specific system as it involves controlling the repetition rate of the two kinds of updating cycles.

More recently, efficiency problems involved in fan speed control schemes were minimized using nonlinear control schemes that are closer to the efficient cooling function of the system. In one example, the fan speed may be controlled by:

- gradually increasing the DC of the control signal whenever the measured temperature is above a predefined high limit,
- gradually decreasing it whenever the measured temperature is below a predefined low limit, and
- keeping the control signal constant/unchanging whenever the measured temperature is within said limits.

This control scheme minimizes some acoustic noise by preventing noisy fan oscillations outside limits, however cooling efficiency is not improved since no adjustments of the control signal are performed within the operating range defined by temperature limits.

An alternate nonlinear control scheme utilizes a multi-step look-up table to program a non-linear transfer function for fan control. This solution provides improved efficiency and reduction in the acoustic noise by allowing rough approximation of a desired nonlinear transfer function. Nonetheless, performing control on the basis of a multi-step look-up table is costly in terms of memory resources and, if the number of steps is low, the scheme may cause abrupt changes of the control signal that result in increased acoustic noise.

In summary, all of the above-described methods have provided solutions to the fan controlled cooling problems that are less than optimal relative to the need in the art. An important goal in cooling system optimization is to generate minimal noise (by setting the control signal at the minimal effective DC) for a given power dissipated by the system. A need therefore exists in the art for efficiently cooling various devices in the system individually or in zones utilizing a nonlinear control scheme. A further need exists in the art for reducing the acoustic noise of fan cooling systems by utilizing a nonlinear cooling control scheme. A yet further need exists in the art for an improved temperature control scheme that allows accurate approximation of desired nonlinear control functions. A still further need exists in the art for an improved temperature control scheme that minimizes the stability problems of the temperature control loop by using a control process that is based a single-loop.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF PREFERRED EMBODIMENTS

To address the above-discussed deficiencies of the prior art, it is a primary object of the present invention to provide, for use with modern computer and communications equipment, a configurable, nonlinear fan control for system-optimized autonomous cooling. The features and technical advantages of the present invention are discussed in this DETAILED DESCRIPTION so that those skilled in the art may better understand the principles of the present invention. Various features and advantages of the invention will be described hereinafter that form the subject of the claims of the invention.

Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Figure 1:
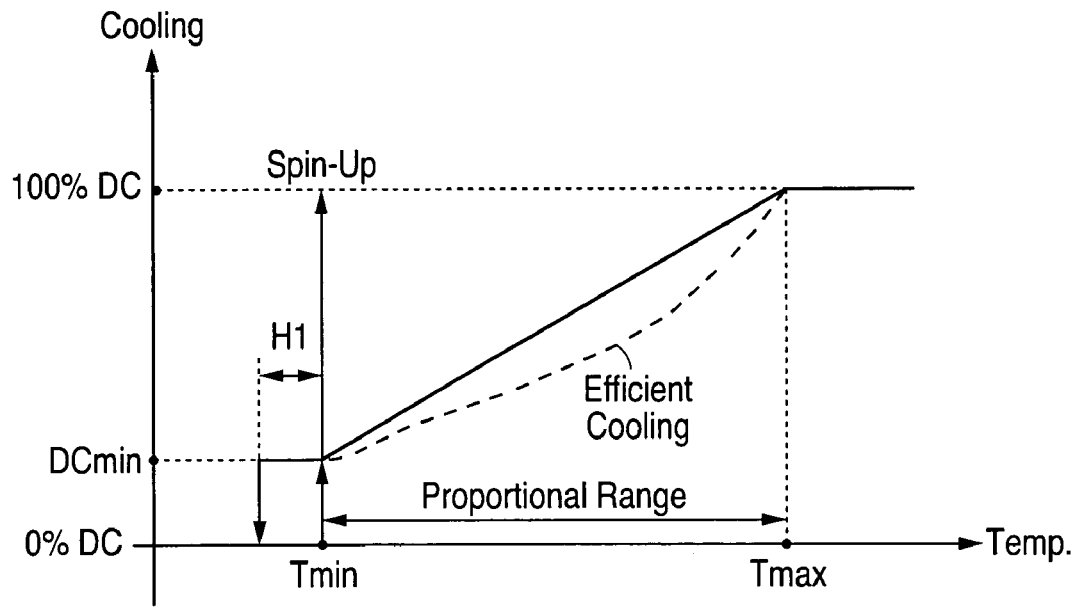
FIG. 1 illustrates a temperature control graph of an exemplary PRIOR ART fan-cooling temperature control scheme.
Figure 2:
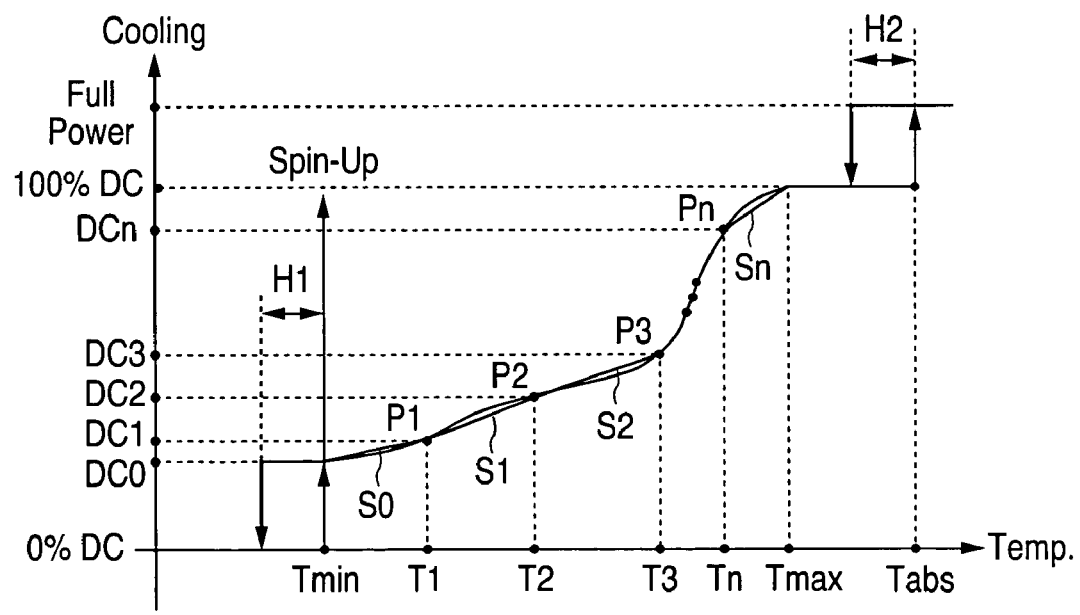
FIG. 2 illustrates a temperature control graph of an exemplary nonlinear fan-cooling temperature control scheme according to principles of the present invention.
Figure 3:
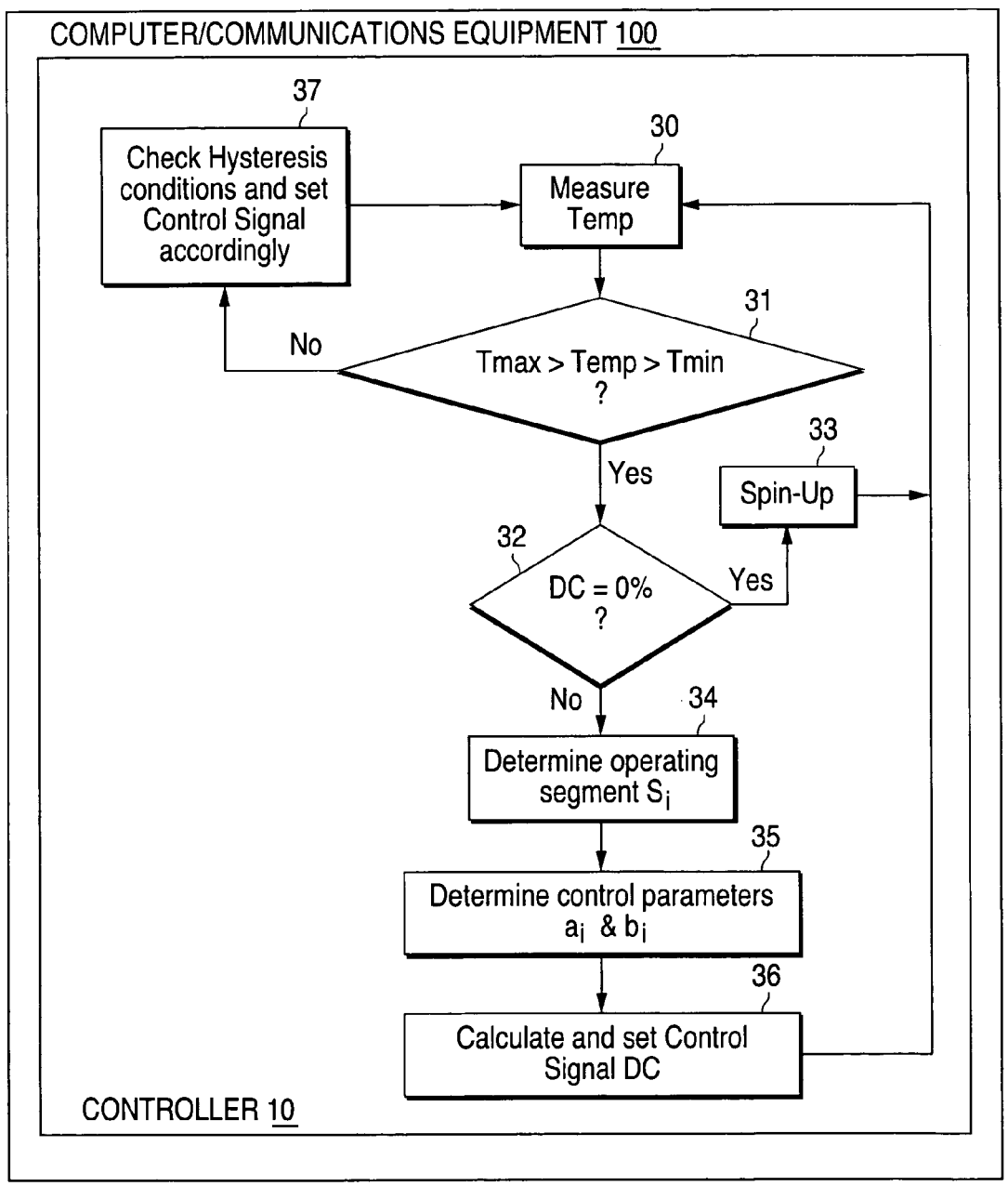
FIG. 3 illustrates a system flow diagram of an exemplary method of operating the nonlinear fan-cooling temperature control scheme according to the principles of the present invention.
Figure 4:
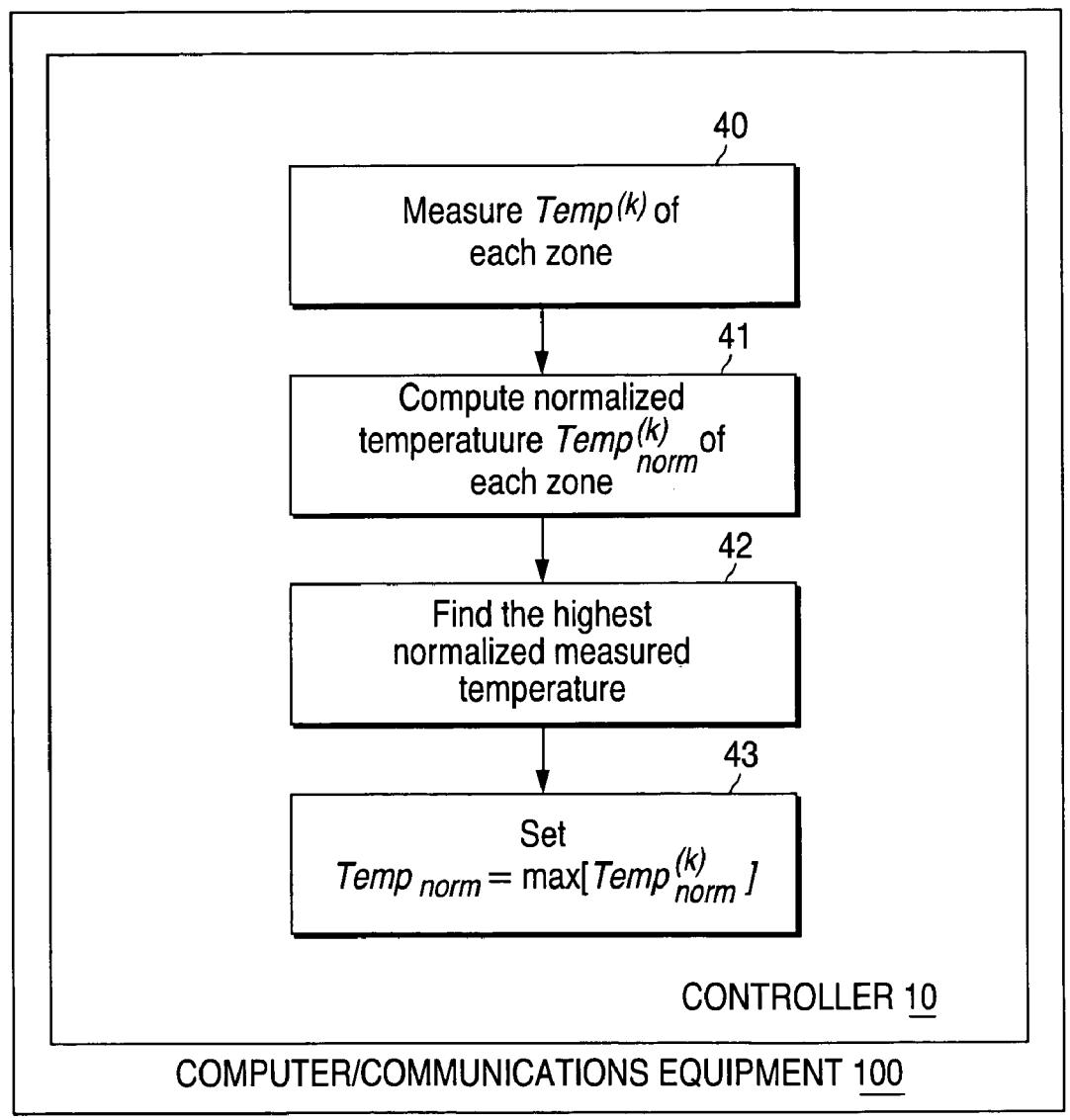
FIG. 4 illustrates a system flow diagram of an exemplary method of controlling fan speed according to temperatures measured from various zones having different ranges according to the principles of the present invention.

FIGS. 2 through 4, and the various embodiments used to describe the principles of the present invention in this patent document, are by way of illustration only. The present invention is directed to a method and system for controlling fan speed by accurately approximating a nonlinear temperature control function to be activated within a given temperature control range. According to an advantageous embodiment, a temperature control scheme allows accurate approximation of a cooling function. Efficient cooling functions are usually nonlinear and hence they are difficult to approximate. The temperature control scheme of the invention results in improved cooling efficiency and thus reduction in the acoustic noise by accurately approximating efficient cooling functions.

Turning to FIG. 2, illustrated is a temperature control graph of an exemplary nonlinear fan-cooling temperature control scheme according to principles of the present invention. According to the illustrated embodiment the nonlinear cooling function curve is divided into numerous linear segments, $S_0, S_1, S_2, \ldots, S_n$.

For each segment ($S_i$), a temperature range ($T_i = T_{i+1}$) and a duty cycle range ($DC_i = DC_{i+1}$) are defined for deriving a slope ($a_i$) to be used according to a measured temperature (Temp). By adjusting the temperature range and the slope of each segment, an accurate approximation of a desired cooling function can be obtained. This cooling function may be used to optimize cooling system performance in terms of fan response, acoustical noise, and cooling efficiency.

According to the control scheme hereof, the measured temperature (Temp) is used to determine the control parameters ($a_i$, $b_i$) that should be used at any given time to derive the DC value of the control signal (DC=$b_i$+$a_i$·Temp). The control parameters of each segment are determined as follows:

$$a_i = \frac{DC_{i+1} - DC_i}{T_{i+1} - T_i}; b_i = \frac{DC_i \cdot T_{i+1} - DC_{i+1} \cdot T_i}{T_{i+1} - T_i}$$

for i=0, 1, 2, 3, ..., n, where $T_0$=Tmin, $T_{n+1}$=Tmax, and $DC_{n+1}$=100%.

A "high" hysteresis range ("H2") may suitably be defined in which the control signal of all the fans is set to a fixed value for activating all the fans in "full" power (e.g., at least approaching 100% DC), if the measured temperature in one zone rises above a critical temperature limit ("Tabs").

The control signal of all the fans remains set to the full power until the measured temperature decreases beyond H2. In this way, the control signal of all the fans is set back to the normal operation value only if the measured temperature has decreased beyond H2, which prevents sequential activations of the full power operation of all the fans, which may be caused due to temperature fluctuations near the Tabs.

Before undertaking the DETAILED DESCRIPTION of FIGS. 3 and 4 below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller might be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

Turning to FIG. 3, illustrated is a system flow diagram of an exemplary method of operating the nonlinear fan-cooling temperature control scheme (generally designated 300) according to the principles of the present invention. Nonlinear fan-cooling temperature control scheme 300 is illustratively associated with controller 10. Exemplary controller 10 operates to divide the temperature control range into numerous linear segments each of which is associated with a sub-range of temperatures and approximates a segment of the control function.

Controller 10 determines control coefficients for each of the linear segments. The controlled temperature is measured and used for determining the corresponding sub-range, and the linear segment. A control signal is then calculated according to the control coefficients of the segment determined by the measured temperature, and it is continuously determined for new measured temperature and used for the activation of one or more fans.

Controller 10 is illustratively associated with exemplary computer and communications equipment 100, such as any of the same found in industry or developed there from in the future for use in fields using computer processing, communications or the like employing system cooling and nonlinear control.

Nonlinear fan-cooling temperature control scheme 300 initially operates to measure the temperature ("Temp") of the controlled device (or zone; process step 30). Scheme 300 determines whether the measured temperature is within the range defined by the minimal ("Tmin") and maximal ("Tmax") temperature limits of the control scheme (Tmax>Temp>Tmin; process step 31).

If the measured temperature is not within this range ("NO" branch of process step 31), the operation of the fan is determined according to the hysteresis ranges (H1 and H2), the currently measured temperature, and current state of fan operation (process step 37), as follows:

If DC of CS=$DC_0$ and Temp is beyond the H1 range then set DC=0%;

If DC of CS="Full Power" and Temp is beyond the H2 range then set DC=100%.

If DC of CS=100% and Temp is above Tabs then set DC="Full Power" (DC=100% for all fans).

Upon completion thereof, control is passed to process step 30, which reinitiates scheme 300.

If the measured temperature is within the range defined by the temperature limits (Tmax>Temp>Tmin; "YES" branch of process step 31), scheme 300 determines if fan operation was previously activated, or whether DC=0% (process step 32).

If DC=0% ("YES" branch of process step 32), then a spin-up cycle is activated (process step 33) and scheme 300 is reinitiated by passing the control to process step 30.

If DC>0% ("NO" branch of process step 32), then the measured temperature (Temp) is used to determine the operating segment $S_i$ to be used with the control scheme (process step 34). Scheme 300 may, for instance, check if:

$T_i$<Temp<$T_{i+1}$ (for $i$=0, 1, 2, . . . , $n$).

After determining the operating segment, scheme 300 determines the control parameters ($a_i$ and $b_i$; process step 35), and DC is calculated and the DC of the control signal is set accordingly (process step 36). Scheme 300 then reinitiates by passing the control to process step 30.

Stated broadly, fan speed control may comprise defining a hysteresis range for setting the control signal to a value of minimal-operation whenever the measured temperature is reduced beyond a low-limit defined by the temperature control range, and setting the control signal to a no-operation (e.g., 0% DC) value whenever the measured temperature is reduced beyond the hysteresis range. An additional hysteresis range may be also defined above a high-limit defined by the temperature control range for setting the control signal to a full-power value whenever the measured temperature reaches this hysteresis range, and setting the control signal to the maximum-operation value whenever the measured temperature is reduced there beyond.

Further, as will be discussed in greater detail here below, "zeroing" one or more segments may reduce a number of linear segments. Optionally, all the segments may be "zeroed" except for one segment for performing linear control. Alternatively, the value of the control signal may be changed gradually from a current value to a newly calculated value, such values being dynamic or not relative to the related process.

Turning lastly to FIG. 4, illustrated is a system flow diagram of an exemplary method (generally designated 400) of controlling fan speed according to temperatures measured from various zones having different ranges according to the principles of the present invention. Scheme 400 for controlling fan speed according to such measured temperatures is illustratively associated with controller 10. Exemplary controller 10 is again illustratively associated with exemplary computer and communications equipment 100.

Exemplary scheme 400 may suitably be used to control cooling of a zone based on temperatures measured from various zones having different temperature ranges of operation ($T_{min}^{(k)}=T_{max}^{(k)}$, k=0, 1, 2, . . . ). According to such an exemplary embodiment, the temperature measured in each zone (Temp$^{(k)}$) may be normalized respective to a temperature range ($T_{min}^{(k)}=T_{max}^{(k)}$) of the respective zone $$\left(e.g., \text{Temp}_{norm}^{(k)} = \frac{\left(\text{Temp}^{(k)} - T_{min}^{(k)}\right)}{\left(T_{max}^{(k)} - T_{min}^{(k)}\right)}\right).$$

Scheme 400 initially operates to measure the temperature ("Temp$^{(k)}$") of each zone (process step 40) and computes a normalized temperature ("Temp$^{(k)}$norm") of each zone (process step 41).

Scheme 400 determines a highest normalized measured temperature (process step 42), and the normalized value of Temp used for controlling the fan speed according to the control scheme hereof is set to the highest normalized measured temperature (Temp$_{norm}$=max[Temp$_{norm}^{(k)}$]; process step 42).

According to an advantageous embodiment hereof, the operating range (Tmin=Tmax) is divided into multiple segments (i.e., advantageously, n=5) to approximate a nonlinear control function. In such an embodiment, the number of segments may suitably be reduced by "zeroing" the temperature and the DC (or duty cycle) range of one or more segments.

For instance, the control scheme can be reduced to one segment, $S_0$, by zeroing the segments $S_1$, $S_2$, . . . , $S_n$ as follows, $T_1=T_2=$ . . . $=T_n$=Tmax and $DC_1=DC_2=$ . . . =$DC_n$=100%. In this way, control scheme 400 (and, more globally, scheme 300), may suitably be reduced where appropriate to the conventional linear control by defining a single segment within the temperature range (Tmin=Tmax) required for the control, and zeroing all other segments.

Acoustic noise can be further reduced by changing PWM DC of the control signal in constant steps (ΔDC), which will prevent abrupt changes of DC in response to abrupt changes of measured temperature. A temperature filter, such as a two- or three-pole IIR low-pass filter, for instance, may also be used in an advantageous embodiment in order to remove interfering noise and possible spikes from the measured temperature. In this way interfering components are not affecting the temperature control operation.

Thus, stated broadly, fan speed control may be carried out by accurately approximating a nonlinear temperature control function to be activated within a given temperature control range by dividing the control range into numerous linear segments each of which is associated with a sub-range of temperature and approximates a segment of the control function and determining control coefficients for each of the linear segments.

The measured temperatures of one or more zones, each having a specific operating temperature range, may suitably be used for normalizing each measured temperature with respect to the specific range of the respective zone. The highest normalized measured temperature is used for calculating a Control Signal according to the control coefficients and the highest normalized temperature. The Control Signal is used for the activation of one or more fans, and is continuously determined according to new measured temperature.

Further, the fan speed control may further comprise setting the control signal to a maximum-operation value (e.g., 100% DC) whenever the measured temperature exceeds a high-limit (Tmax) defined by the temperature control range, or setting it to a minimum-operation value (e.g., DCmin) whenever the measured temperature falls beyond a low-limit (Tmin) defined by the temperature control range.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A controller operable to control a fan speed of a fan by approximating a nonlinear temperature control function associated with a temperature control range, the controller operable to approximate the nonlinear temperature control function by:
   dividing the temperature control range into a plurality of segments, each segment associated with a sub-range of temperatures;
   determining one or more control coefficients for each of the segments; and
   generating a control signal using the one or more control coefficients for at least one of the segments and one or more measured temperatures that have been normalized, the control signal capable of controlling the fan speed of the fan.

2. The controller of claim 1, wherein the controller is capable of generating the control signal by:
   selecting one of the segments using one of the measured temperatures; and
   using the one or more control coefficients for the selected segment to generate the control signal.

3. The controller of claim 2, wherein the controller is capable of generating the control signal by:
   selecting another of the segments using a second of the measured temperatures; and
   using the one or more control coefficients for the other selected segment to generate the control signal.

4. The controller of claim 1, wherein the controller is capable of generating the control signal by at least one of:
   setting the control signal to a maximum value if one of the measured temperatures exceeds an upper limit of the temperature control range;
   setting the control signal to a minimum value if the measured temperature falls below a lower limit of the temperature control range;
   setting the control signal to one of two values if the measured temperature exceeds the upper limit of the temperature control range, the one of two values selected depending on whether the measured temperature falls within a first hysteresis range; and
   setting the control signal to one of two values if the measured temperature falls below the lower limit of the temperature control range, the one of two values selected depending on whether the measured temperature falls within a second hysteresis range.

5. The controller of claim 1, wherein the controller is capable of generating the control signal by:
   identifying temperatures of a plurality of zones, each zone having an associated operating temperature range;
   normalizing each temperature with respect to the associated operating temperature range;
   identifying a highest normalized temperature;
   generating the control signal using the one or more control coefficients for at least one of the segments and the highest normalized temperature; and
   providing the control signal to fans in the plurality of zones.

6. The controller of claim 1, wherein the controller is further capable of reducing a number of segments by zeroing one or more of the segments.

7. The controller of claim 1, wherein the one or more measured temperatures are filtered prior to use in generating the control signal.

8. The controller of claim 1, wherein the plurality of segments comprise a plurality of linear segments, each linear segment approximating a corresponding segment of the nonlinear temperature control function.

9. The controller of claim 1, wherein:
   the control signal is associated with a duty cycle range;
   each segment is further associated with a sub-range of duty cycles; and
   determining the one or more control coefficients for each of the segments comprises using formulas of:

$$a_i = \frac{DC_{i+1} - DC_i}{T_{i+1} - T_i}; \text{ and}$$

$$b_i = \frac{DC_i \cdot T_{i+1} - DC_{i+1} \cdot T_i}{T_{i+1} - T_i}$$

where a and b represent the control coefficients for one of the segments, $T_i$ represents a lower limit of the sub-range of temperatures for the segment, $T_{i+1}$ represents an upper limit of the sub-range of temperatures for the segment, $DC_i$ represents a lower limit of the sub-range of duty cycles for the segment, and $DC_{i+1}$ represents an upper limit of the sub-range of duty cycles for the segment.

10. The controller of claim 1, wherein the controller is further capable of normalizing each of the one or more measured temperatures with respect to one or more operating temperature ranges associated with one or more temperature zones.

11. An apparatus, comprising:
   a fan having a speed based on a control signal; and
   a controlled capable of generating the control signal by approximating a nonlinear temperature control function associated with a temperature control range, the controller capable of approximating the nonlinear temperature control function by:
  dividing the temperature control range into a plurality of segments, each segment associated with a sub-range of temperatures;
  determining one or more control coefficients for each of the segments; and
  generating the control signal using the one or more control coefficients for at least one of the segments and one or more measured temperatures that have been normalized.

12. The apparatus of claim 11, wherein:
the apparatus further comprises a sensor capable of measuring the temperature in a zone associated with the fan; and
the controller is capable of generating the control signal by:
  selecting one of the segments using one of the measured temperatures from the sensor; and
  using the one or more control coefficients for the selected segment to generate the control signal.

13. The apparatus of claim 12, wherein the controller is capable of generating the control signal by:
  selecting another of the segments using a second of the measured temperatures from the sensor; and
  using the one or more control coefficients for the other selected segment to generate the control signal.

14. The apparatus of claim 11, wherein:
the apparatus further comprises a sensor capable of measuring the temperature in a zone associated with the fan; and
the controller is capable of generating the control signal by at least one of:
  setting the control signal to a maximum value if one of the measured temperatures from the sensor exceeds an upper limit of the temperature control range;
  setting the control signal to a minimum value if the measured temperature falls below a lower limit of the temperature control range;
  setting the control signal to one of two values if the measured temperature exceeds the upper limit of the temperature control range, the one of two values selected depending on whether the measured temperature falls within a first hysteresis range; and
  setting the control signal to one of two values if the measured temperature falls below the lower limit of the temperature control range, the one of two values selected depending on whether the measured temperature falls within a second hysteresis range.

15. The apparatus of claim 11, wherein:
the fan comprises one of a plurality of fans associated with a plurality of zones, each zone having an associated operating temperature range;
the apparatus further comprises a plurality of sensors capable of measuring the temperatures in the zones; and
the controller is capable of generating the control signal by:
  receiving the measured temperatures from the plurality of sensors;
  normalizing each measured temperature with respect to the associated operating temperature range;
  identifying a highest normalized measured temperature;
  generating the control signal using the one or more control coefficients for at least one of the segments and the highest normalized measured temperature; and
  providing the control signal to the fans in the plurality of zones.

16. The apparatus of claim 11, wherein the controller is further capable of reducing a number of segments by zeroing one or more of the segments.

17. The apparatus of claim 11, wherein:
the apparatus further comprises a filter capable of filtering the one or more measured temperatures.

18. A method, comprising:
dividing a temperature control range associated with a nonlinear temperature control function for a fan into a plurality of segments, each segment associated with a sub-range of temperatures;
determining one or more control coefficients for each of the segments; and
generating a control signal using the one or more control coefficients for at least one of the segments and one or more measured temperatures that have been normalized, the control signal capable of controlling a fan speed of the fan.

19. The method of claim 18, wherein generating the control signal comprises:
  selecting one of the segments using a first of the measured temperatures;
  using the one or more control coefficients for the selected segment to generate the control signal;
  selecting another of the segments using a second of the measured temperatures; and
  using the one or more control coefficients for the other selected segment to generate the control signal.

20. The method of claim 18, wherein generating the control signal comprises at least one of:
  setting the control signal to a maximum value if one of the measured temperatures exceeds an upper limit of the temperature control range;
  setting the control signal to a minimum value if the measured temperature falls below a lower limit of the temperature control range;
  setting the control signal to one of two values if the measured temperature exceeds the upper limit of the temperature control range, the one of two values selected depending on whether the measured temperature falls within a first hysteresis range; and
  setting the control signal to one of two values if the measured temperature falls below the lower limit of the temperature control range, the one of two values selected depending on whether the measured temperature falls within a second hysteresis range.

21. The method of claim 18, wherein generating the control signal comprises:
  identifying temperatures of a plurality of zones, each zone having an associated operating temperature range;
  normalizing each temperature with respect to the associated operating temperature range;
  identifying a highest normalized temperature;
  generating the control signal using the one or more control coefficients for at least one of the segments and the highest normalized temperature; and
  providing the control signal to fans in the plurality of zones.

* * * * *